(12) United States Patent
Ueda et al.

(10) Patent No.: US 8,414,187 B2
(45) Date of Patent: Apr. 9, 2013

(54) PYROELECTRIC TEMPERATURE SENSOR AND A METHOD FOR MEASURING A TEMPERATURE WITH THE PYROELECTRIC TEMPERATURE SENSOR

(75) Inventors: Michihito Ueda, Kyoto (JP); Hiroyuki Tanaka, Kyoto (JP); Yukihiro Kaneko, Osaka (JP); Eiji Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/207,940

(22) Filed: Aug. 11, 2011

(65) Prior Publication Data

US 2011/0299566 A1   Dec. 8, 2011

Related U.S. Application Data

(63) Continuation of application No. PCT/JP2011/000888, filed on Feb. 17, 2011.

(30) Foreign Application Priority Data

Mar. 11, 2010 (JP) ................................. 2010-053977

(51) Int. Cl.
*G01K 7/01* (2006.01)
*G01J 5/00* (2006.01)

(52) U.S. Cl.
USPC ............ 374/178; 374/177; 374/121; 257/295

(58) Field of Classification Search .................. 374/120, 374/121, 177, 178, 179; 365/65, 145; 438/3; 257/295, 256
See application file for complete search history.

(56) References Cited

U.S. PATENT DOCUMENTS

| | | | | |
|---|---|---|---|---|
| 3,426,255 | A | * | 2/1969 | Heywang ........................ 257/314 |
| 5,818,043 | A | * | 10/1998 | Buchy et al. .................... 250/332 |
| 5,980,106 | A | | 11/1999 | Yamamoto et al. |
| 6,014,073 | A | * | 1/2000 | Torii et al. ........................ 338/25 |
| 6,107,656 | A | * | 8/2000 | Igarashi ........................... 257/295 |

(Continued)

FOREIGN PATENT DOCUMENTS

| | | | |
|---|---|---|---|
| GB | 2200246 A | * | 7/1988 |
| JP | 59-011841 | | 3/1984 |

(Continued)

OTHER PUBLICATIONS

International Search Report, with English translation, issued in International Patent Application No. PCT/JP2011/000888, dated Apr. 19, 2011.

*Primary Examiner* — Gail Verbitsky
(74) *Attorney, Agent, or Firm* — McDermott Will & Emery LLP

(57) ABSTRACT

A temperature sensor includes first and second lower electrodes, a ferroelectric layer having polarization, a semiconductor layer; and first to third upper electrodes. The second upper electrode is interposed between the first upper electrode and the third upper electrode in a plan view. The semiconductor layer includes a first channel disposed between the first upper electrode and the second upper electrode, and a second channel disposed between the second upper electrode and the third upper electrode. The ferroelectric layer includes a first ferroelectric part disposed below the first channel and a second ferroelectric part disposed below the second channel. A polarization direction of the first ferroelectric part is opposite to a polarization direction of the second first ferroelectric part. The temperature is calculated based on the output voltage from the second upper electrode and the voltage applied to the first upper electrode.

31 Claims, 10 Drawing Sheets

U.S. PATENT DOCUMENTS

| | | | |
|---|---|---|---|
| 6,541,281 B2 * | 4/2003 | Ramesh | 438/3 |
| 6,649,424 B2 * | 11/2003 | Mort et al. | 438/3 |
| 6,664,118 B2 * | 12/2003 | Nishihara et al. | 438/3 |
| 7,732,847 B2 * | 6/2010 | Tanaka et al. | 257/295 |
| 7,928,479 B2 * | 4/2011 | Wang | 257/259 |
| 2010/0224919 A1 * | 9/2010 | Bauer et al. | 257/295 |
| 2011/0165702 A1 * | 7/2011 | Wang | 438/3 |
| 2011/0182320 A1 * | 7/2011 | Noda | 374/121 |
| 2012/0057616 A1 * | 3/2012 | Padilla et al. | 374/179 |
| 2012/0077287 A1 * | 3/2012 | Summerfelt et al. | 438/3 |
| 2012/0171785 A1 * | 7/2012 | Takamatsu et al. | 438/3 |
| 2012/0292677 A1 * | 11/2012 | Dubourdieu et al. | 257/295 |

FOREIGN PATENT DOCUMENTS

| | | |
|---|---|---|
| JP | 59-011841 B2 | 3/1984 |
| JP | 02-137268 | 5/1990 |
| JP | 10-318849 | 12/1998 |
| JP | 2006-203009 | 8/2006 |

* cited by examiner

| TEMPERATURE OF THERMOSTATIC BATH [°C] | CALCULATED TEMPERATURE[°C] |
|---|---|
| 20 | 20.2 |
| 30 | 29.8 |
| 40 | 39.7 |
| 50 | 50.0 |
| 60 | 60.3 |
| 70 | 70.4 |
| 80 | 80.0 |

| TEMPERATURE OF THERMOSTATIC BATH [°C] | CALCULATED TEMPERATURE[°C] (PZT) | CALCULATED TEMPERATURE[°C] (PTO) |
|---|---|---|
| 20 | 20.1 | 20.2 |
| 30 | 29.7 | 29.6 |
| 40 | 39.7 | 39.6 |
| 50 | 49.8 | 49.6 |
| 60 | 59.7 | 59.6 |
| 70 | 69.8 | 69.8 |
| 80 | 80.0 | 80.0 |

PYROELECTRIC TEMPERATURE SENSOR AND A METHOD FOR MEASURING A TEMPERATURE WITH THE PYROELECTRIC TEMPERATURE SENSOR

This is a continuation of International Application No. PCT/JP2011/000888, with an international filing date of Feb. 17, 2011, which claims priority of Japanese Patent Application No. 2010-053977, filed on Mar. 11, 2010, the contents of which are hereby incorporated by reference.

BACKGROUND OF THE INVENTION

1. Field of the Invention

The present disclosure relates to a pyroelectric temperature sensor and a method for measuring the temperature with a pyroelectric temperature sensor.

2. Description of the Related Art

An amount of charge on the surface of a pyroelectric body increases or decreases depending on temperature change. This is referred to as pyroelectric effect. A pyroelectric temperature sensor detects temperature by utilizing the pyroelectric effect. Japanese Laid-open patent publication No. Hei 2-137268 (Hereinafter, Patent document 1) discloses a conventional pyroelectric temperature sensor comprising a structure of a pyroelectric body and a semiconductor.

FIG. 14 shows a cross-sectional view of the conventional pyroelectric temperature sensor disclosed in the patent document 1. The conventional pyroelectric temperature sensor comprises a pyroelectric film 101, a sensor electrode 102, a semiconductor film 103, a source electrode 104, a drain electrode 105, an interlayer insulation film 106, and an extraction electrode 107.

By the pyroelectric effect due to temperature change, a potential at the position near the interface between the pyroelectric film 101 and the semiconductor layer 103 is modulated. The modulation forms a channel layer or a depletion layer in the semiconductor layer 103. The formation of the channel layer or the depletion layer changes electroconductivity of the semiconductor layer 103 greatly. Thus, the temperature change in the pyroelectric film is converted into change of the amount of a drain current of a thin film transistor formed in the semiconductor layer 103.

However, according to the patent document 1, it is impossible to obtain an amplification characteristic greater than that of the thin film transistor. Furthermore, detection of the amount of the drain current requires a complicated external circuit.

SUMMARY OF THE INVENTION

The purpose of the present subject matter is to provide a method for measuring a temperature with a small pyroelectric temperature sensor having higher sensitivity.

The present invention provides a method for measuring a temperature with a temperature sensor, the method comprises the following steps (a) to (c):

a step (a) of preparing the temperature sensor, the temperature sensor comprises a lower electrode group, a ferroelectric layer, a semiconductor layer, and an upper electrode group, the lower electrode group, the ferroelectric layer, the semiconductor layer, and the upper electrode group are stacked in this order, the lower electrode group comprises a first lower electrode and a second lower electrode, the upper electrode group comprises a first upper electrode, a second upper electrode, and a third upper electrode, the second upper electrode is interposed between the first upper electrode and the third upper electrode, a first ferroelectric part of the ferroelectric layer is interposed between the first lower electrode and the first upper electrode, a second ferroelectric part of the ferroelectric layer is interposed between the second lower electrode and the third upper electrode, the second part has an inverted polarization direction of the polarization direction of the first ferroelectric part, a first channel is configured in the portion of the semiconductor which is interposed between the first upper electrode and the second upper electrode, and a second channel is configured in the portion of the semiconductor which is interposed between the second upper electrode and the third upper electrode, a step (b) of applying a voltage $V_{DD}$ and a voltage of 0V to the first upper electrode and the third upper electrode respectively to measure an output voltage $V_{OUT}$ from the second upper electrode, and a step (c) of calculating the temperature from the following equation (2):

$$T = \frac{\{(R_{d1}+R_{u1})T_2 - (R_{d2}+R_{u2})T_1\}V_{out} + (R_{u2}T_1 - R_{u1}T_2)V_{DD}}{(R_{d1}-R_{d2}+R_{u1}-R_{u2})V_{out} + (R_{u2}-R_{u1})V_{DD}} \quad (2)$$

wherein, $R_{d1}$ represents the resistance value of the first channel when the temperature T of the ferroelectric layer is $T_1$, $R_{u1}$ represents the resistance value of the second channel when the temperature T of the ferroelectric layer is $T_1$, $R_{d2}$ represents the resistance value of the first channel when the temperature T of the ferroelectric layer is $T_2$, $R_{u2}$ represents the resistance value of the second channel when the temperature T of the ferroelectric layer is $T_2$.

The present subject matter includes the aforementioned temperature sensor.

The present subject matter includes a temperature measuring device comprising the aforementioned temperature sensor and a calculating device.

The calculating device comprises a processing unit, a memory unit, an output unit, and an input unit.

The output voltage $V_{OUT}$ from the second upper electrode is input to the input unit.

The memory unit memorizes constant values of $R_{d1}$, $R_{u1}$, $R_{d2}$, and $R_{u2}$.

The processing unit calculates the temperature T on the basis of the equation (2) with reference to the memory unit.

The output unit outputs the calculated temperature T.

The present subject matter provides a method for measuring a temperature using a pyroelectric temperature sensor with high sensitivity.

Other features, elements, processes, steps, characteristics and advantages of the present invention will become more apparent from the following detailed description of preferred embodiments of the present invention with reference to the attached drawings.

DETAILED DESCRIPTION OF PREFERRED EMBODIMENTS

The embodiment of the present disclosure is described below with reference to the drawings.

Embodiment 1

Figure 1:
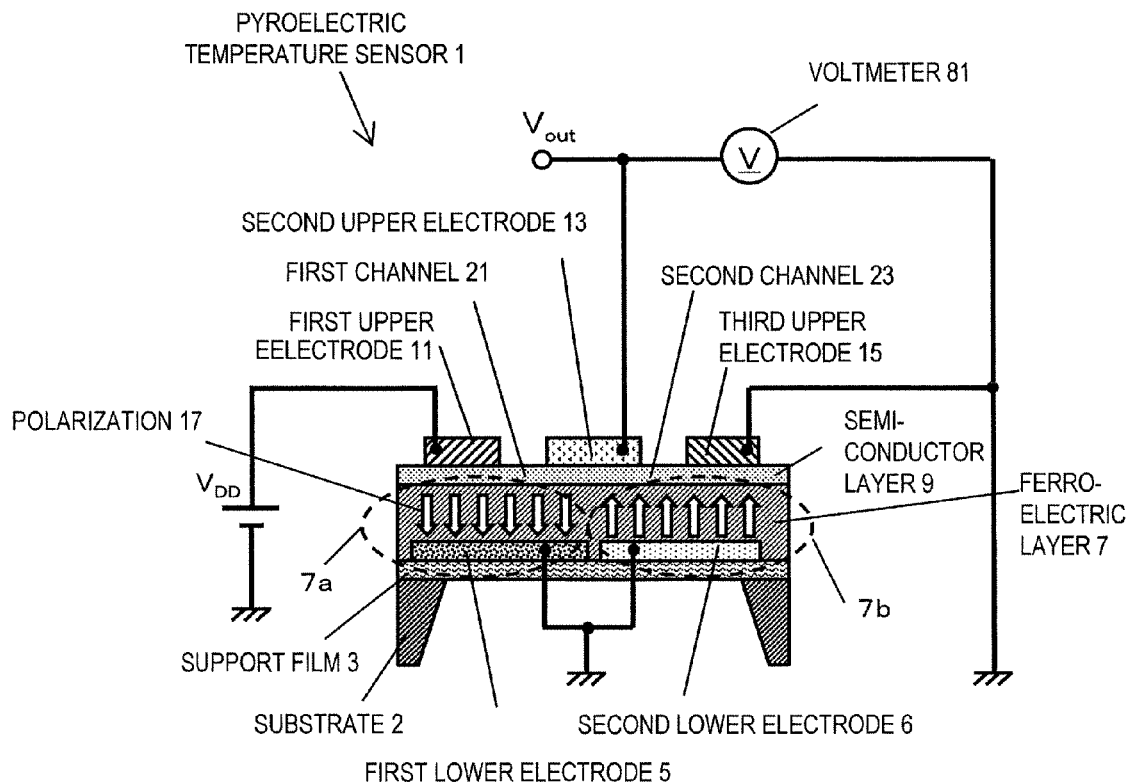
FIG. 1 shows an exemplary view of a pyroelectric temperature sensor according to the embodiment 1.

FIG. 1 shows the pyroelectric temperature sensor 1 according to the embodiment 1.

As shown in FIG. 1, the present pyroelectric temperature sensor 1 comprises a substrate 2, a support film 3, a lower electrode group 5, 6, a ferroelectric layer 7 as a pyroelectric layer, a semiconductor layer 9, and an upper electrode group 11, 13, 15.

The lower electrode group 5, 6, the ferroelectric layer 7, the semiconductor layer 9, and the upper electrode group are stacked in this order.

The lower electrode group comprises a first lower electrode 5 and a second lower electrode 6.

The upper electrode group comprises a first upper electrode 11, a second upper electrode 13, and a third upper electrode 15.

The second upper electrode 13 is interposed between the first upper electrode 11 and the third upper electrode 15 in a plan view.

A first channel 21 is formed in the portion of the semiconductor 9 which is interposed between the first upper electrode 11 and the second upper electrode 13.

A second channel 23 is formed in the portion of the semiconductor 9 which is interposed between the second upper electrode 13 and the third upper electrode 15.

A first ferroelectric part 7a of the ferroelectric layer 7 is interposed between the first lower electrode 5 and the first upper electrode 11. Specifically, the first ferroelectric part 7a is located beneath the first channel 21.

A second ferroelectric part 7b of the ferroelectric layer 7 is interposed between the second lower electrode 6 and the third upper electrode 15. Specifically, the second ferroelectric part 7b is located beneath the second channel 23.

The polarization direction in the second ferroelectric part 7b is opposite to the polarization direction in the first ferroelectric part 7a.

The arrows in FIG. 1, FIG. 3, FIG. 4, and FIG. 5 represent the direction of the polarization 17 in the ferroelectric layer 7. In the present specification, the direction of the arrows is defined so that positive electric charges are eccentrically located at the tip of the arrow. In the present specification, it is defined that the polarization 17 is upward when the tip of the arrows is directed toward the semiconductor layer 9. On the contrary, it is defined that the polarization 17 is downward when the tip of the arrows is directed toward the support film 3.

In FIG. 1, the output voltage $V_{out}$ represents the potential of the second upper electrode 13 measured with a voltmeter 81.

Figure 2:
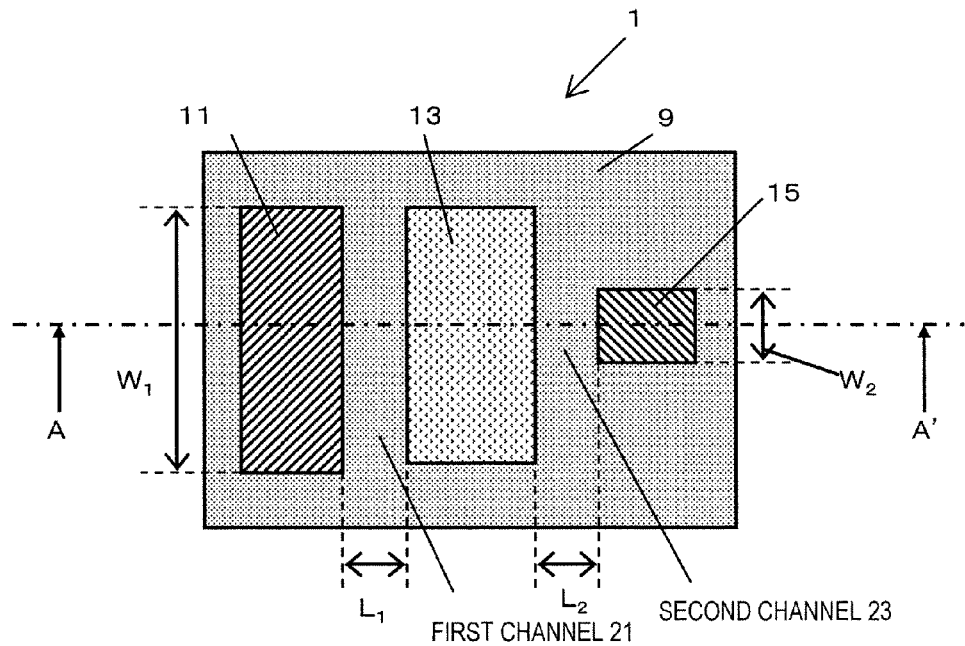
FIG. 2 shows an exemplary top view of the pyroelectric temperature sensor according to the embodiment 1.

FIG. 2 shows a top view of the pyroelectric temperature sensor according to the embodiment 1. FIG. 1 shows a cross-sectional view of A-A' in FIG. 2. The first upper electrode 11 and the second upper electrode 13 serve as the drain electrode and source electrode of the first channel 21, respectively. The second upper electrode 13 and the third upper electrode 15 serve the drain electrode and the source electrode of the second channel 23, respectively.

The first channel 21 has a width of $W_1$ and a length of $L_1$. The second channel 23 has a width of $W_2$ and a length of $L_2$ as shown in FIG. 2

A channel size ratio α is defined in accordance with the following equation (1).

$$\alpha = (W_1/L_1)/(W_2/L_2) \tag{1}$$

Figure 3:
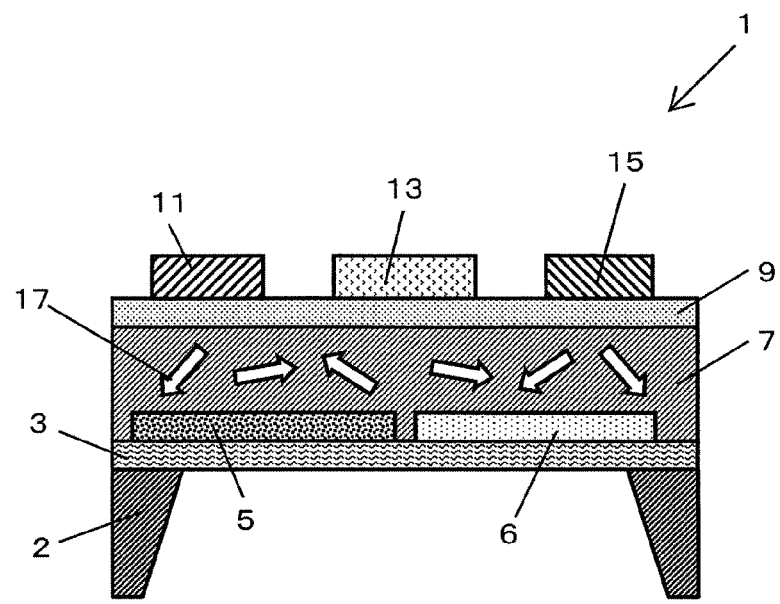
FIG. 3 shows an exemplary cross-sectional view of the pyroelectric temperature sensor at an initial stage.

FIG. 3 shows a cross-sectional view of the pyroelectric temperature sensor at an initial stage. As shown in FIG. 3, the direction of the polarization 17 is not generally determined at the initial stage.

Figure 4:
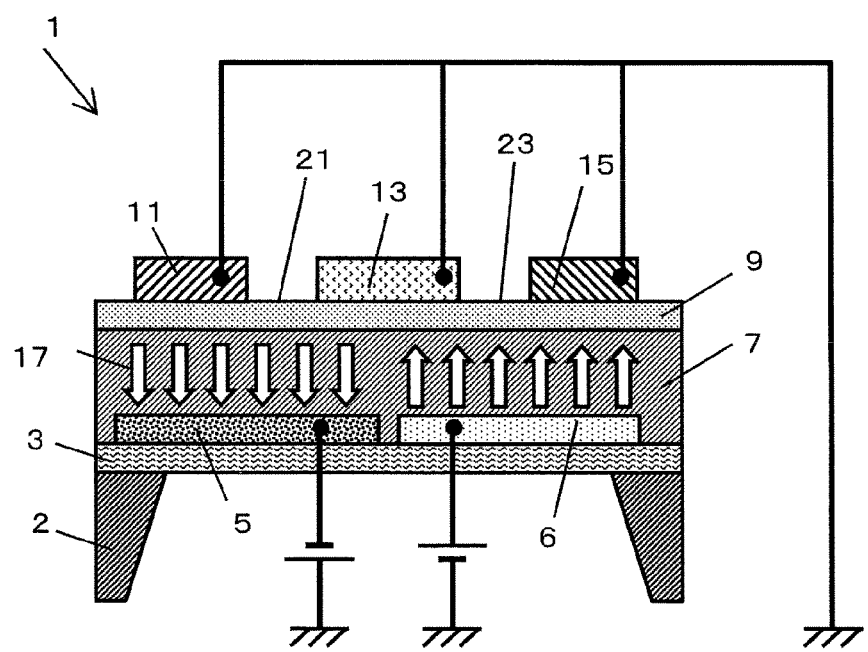
FIG. 4 shows how to arrange the directions of polarization 17.

FIG. 4 shows how to determine the direction of the polarization 17. As shown in FIG. 4, the negative voltage and the positive voltage are applied to the first lower electrode 5 and the second lower electrode 6, respectively, while the first upper electrode 11, the second upper electrode 13, and the upper third electrode 15 are grounded. Subsequently, the voltages are removed. Thus, the polarization 17 is determined as shown in FIG. 4. Namely, the direction of the polarization 17 in the first ferroelectric part 7a of the ferroelectric layer 7, which is located below the first channel 21, is arranged to be substantially downward. On the contrary, the second ferroelectric part 7b of the ferroelectric layer 7, which is located below the second channel 23, is arranged to be substantially upward.

Figure 5A:
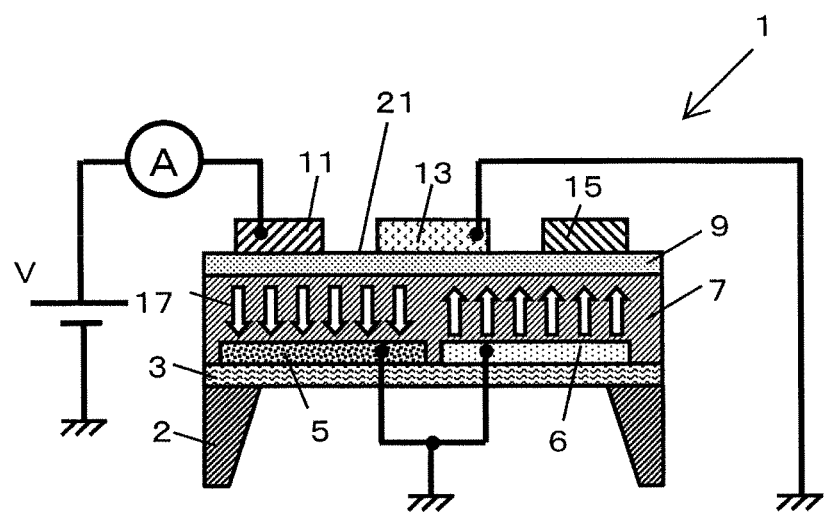
FIG. 5A and FIG. 5B show how to measure the resistance values of first channel 21 and the second channel 23, respectively.

Subsequently, the resistance values of the first channel 21 and the second channel 23 are measured. FIG. 5A and FIG.

5B show how to measure the resistance values of the first channel 21 and the second channel 23, respectively.

As shown in FIG. 5A, while the second upper electrode 13, the first lower electrode 5 and the second lower electrode 6 are grounded, the positive voltage is applied to the first upper electrode 11 to measure a current value flowing through the first channel 21. Furthermore, the relationship between the resistance value and the temperature of the first channel 21 is obtained by varying the temperature of the pyroelectric temperature sensor 1 by a heating means (not shown).

Figure 5B:
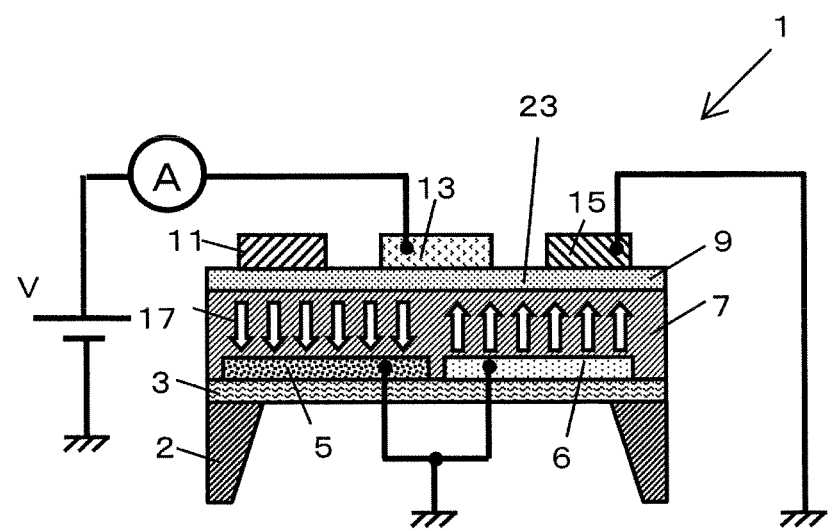

As shown in FIG. 5B, while the third upper electrode 15, the first lower electrode 5, and the second lower electrode 6 are grounded, the positive voltage is applied to the second upper electrode 13 to measure the current value flowing through the second channel 23. Similarly to FIG. 5A, the relationship between the resistance value and the temperature of the second channel 23 is obtained by varying the temperature of the pyroelectric temperature sensor 1 by the heating means (not shown).

Thus, the resistance values $R_{d1}$, $R_{u1}$, $R_{d2}$, and $R_{u2}$ are obtained.

$R_{d1}$ represents the resistance value of the first channel 21 when the temperature T of the ferroelectric layer 7 is $T_1$.

$R_{u1}$ represents the resistance value of the second channel 23 when the temperature T of the ferroelectric layer 7 is $T_1$.

$R_{d2}$ represents the resistance value of the first channel 21 when the temperature T of the ferroelectric layer 7 is $T_2$.

$R_{u2}$ represents the resistance value of the second channel 23 when the temperature T of the ferroelectric layer 7 is $T_2$.

Next, it is described how to measure a temperature by using the pyroelectric temperature sensor 1 configured as described above.

As shown in FIG. 1, source voltage $V_{DD}$ is applied to the first upper electrode 11. The source voltage $V_{DD}$ is divided in accordance with the resistance value $R_d$ of the first channel 21 and the resistance value $R_u$ of the second channel 23, and the potential of the second upper voltage 13 is output as the output voltage $V_{out}$.

The resistance value $R_d$ and the resistance value $R_u$ vary depending on the change of the temperature T. This causes the output voltage $V_{out}$ to vary.

The present inventors discovered that the temperature T of the ferroelectric layer 7 is measured from the following equation (2), which include the output electrode $V_{out}$, the resistance value $R_{d1}$, the resistance value $R_{u1}$, the resistance value $R_{d2}$, and the resistance value $R_{u2}$.

$$T = \frac{\{(R_{d1} + R_{u1})T_2 - (R_{d2} + R_{u2})T_1\}V_{out} + (R_{u2}T_1 - R_{u1}T_2)V_{DD}}{(R_{d1} - R_{d2} + R_{u1} - R_{u2})V_{out} + (R_{u2} - R_{u1})V_{DD}} \quad (2)$$

As shown in FIG. 7, the present inventors discovered that the resistance value of the channel is proportional to the temperature of the ferroelectric layer 7. Furthermore, the present inventors discovered the relationship where the gradient of the proportionality is inverted when the direction of the polarization is inverted.

Namely, the resistance value of the first channel 21 decreases, when the temperature of the first channel 21 increases, which is in contact with the first ferroelectric part 7a having the downward polarization. The decrease of the resistance value of the first channel 21 is proportional to the increase of the temperature.

On the contrary, when the resistance value of the second channel 23 increases, when the temperature of the second channel 23 increases, which is in contact with the second ferroelectric part 7b having the upward polarization. The increase of the resistance value of the second channel 23 is proportional to the increase of the temperature.

Needless to say, the resistance value of the first channel 21 increases, when the temperature of the first channel 21 decreases, which is contact with the first ferroelectric part 7a having the downward polarization. The increase of the resistance value of the first channel 21 is proportional to the decrease of the temperature.

On the contrary, the resistance value of the second channel 23 decreases, when the temperature of the second channel 23 decreases, which is in contact with the second ferroelectric part 7b having the upward polarization. The decrease of the second channel 23 is proportional to the decrease of the temperature.

The pyroelectric temperature sensor of the present invention may be utilized for temperature measurement under 150° C. When the temperature is over 150° C., the polarization may be unstable. It is preferred that temperature sensor of the present disclosure is used for the temperature measurement over −200° C.

Figure 15:
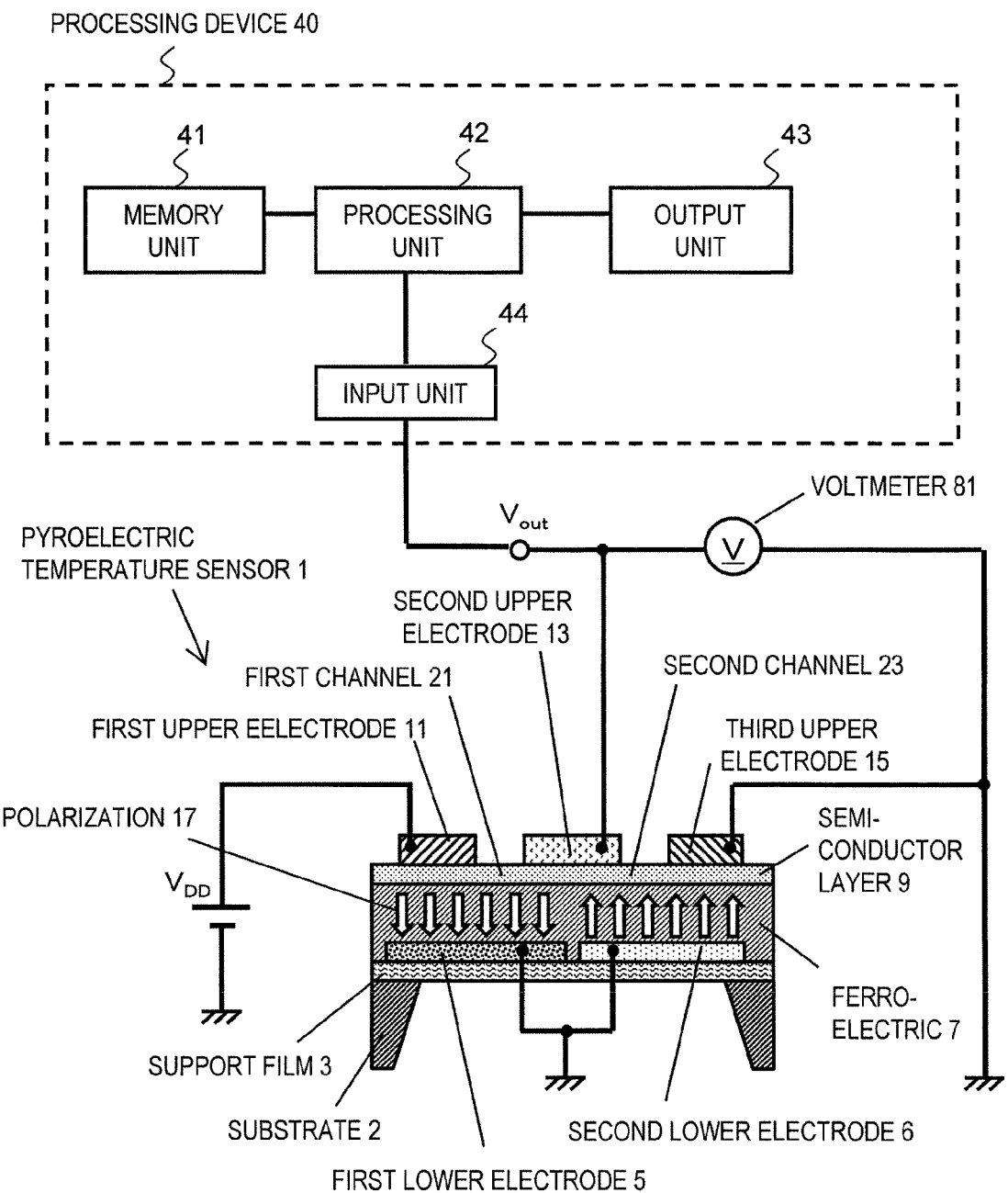
FIG. 15 shows an example of the pyroelectric temperature sensor 1 and a processing device 40 according to the present disclosure.

The temperature measuring device of the present disclosure comprises the above-mentioned pyroelectric temperature sensor 1 and a processing device 40. As shown in FIG. 15, the processing device 40 comprises a processing unit 42, a memory unit 41, an output unit 43, and an input unit 44. The output voltage $V_{OUT}$ from the second upper electrode 13 is input to the input unit 44. The memory unit 41 memorizes the aforementioned values of $R_{d1}$, $R_{u1}$, $R_{d2}$, and $R_{u2}$, together with $T_1$ and $T_2$, as constant values. These constant values have been memorized in the memory unit 41 until the temperature measuring device fabricated in a factory is shipped from the factory. Namely, the present subject matter includes the temperature measuring device in which these constant values are memorized when it is shipped from the factory.

A user of the temperature measuring device 1 brings the pyroelectric temperature sensor 1 in contact with the object of which the user wants to know the temperature. For example, the rear face of the support film 3 can be in contact with the object. The processing unit 42 calculates the temperature T on the basis of the equation (2) with reference to the constant values memorized in the memory unit 41. The output unit 43 outputs the calculated temperature T. Thus, the user receives the temperature T of the object. The object may be a gas, a liquid, or a solid.

EXAMPLES

The following examples describe the present subject matter in more detail.

Example 1

FIG. 6 shows a method of fabricating a pyroelectric temperature sensor.

(a) A $SrTiO_3$ film with a thickness of 150 nm was deposited on a MgO(100) monocrystalline substrate 2 under a temperature of 700 degree Celsius with a pulse laser deposition method (hereinafter "PLD process") to form a support film 3.

Figure 6A:
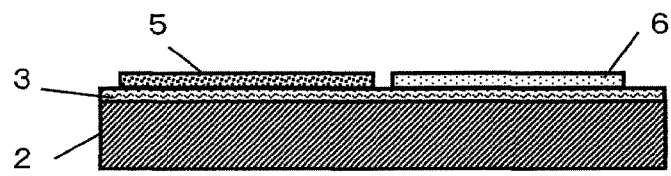
FIGS. 6A to 6D show an exemplary method of fabricating a pyroelectric temperature sensor.

After the temperature of the substrate 2 was set to be 400 degree Celsius, a platinum film with a thickness of 200 nm was deposited with the PLD process. A resist (not shown) was applied and patterned to form an etching mask. The platinum film was etched with reactive ion etching process using $CF_4$ gas. Subsequently, as shown in FIG. 6A, the first lower electrode 5 and the second lower electrode 6 were formed.

Figure 6B:
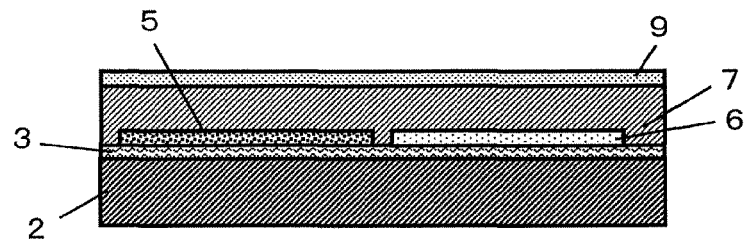

(b) After the temperature of the substrate 2 was set to be 600 degree Celsius, a PLT film of a thickness of 500 nm was deposited with the PLD process. Thus, as shown in FIG. 6B, the ferroelectric layer 7 was deposited. The ratio of Pb to La in the (Pb,La)TiO₃ film (PLT film) was set to be nine. After the temperature of the substrate 2 was set to be 400 degree Celsius, a ZnO film with a thickness of 30 nm was deposited with the PLD process to form the semiconductor layer 9.

Figure 6C:
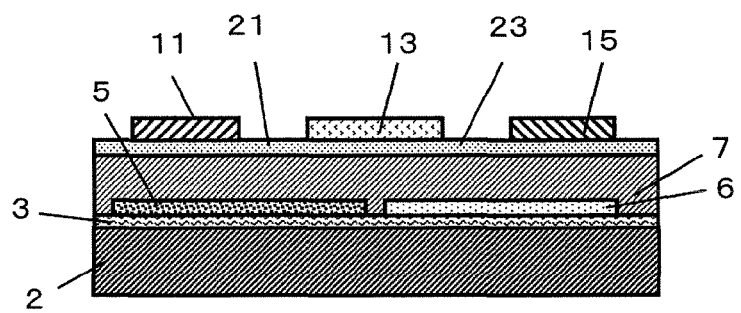
Figure 6D:
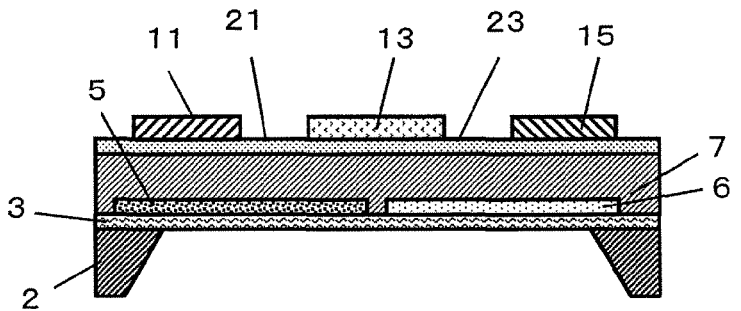

(c) A resist (not shown) was applied and patterned. Furthermore, a platinum film with a thickness of 50 nm was deposited with an EB deposition process. Using a liftoff process to remove the resist, as shown in FIG. 6C, the first upper electrode 11, the second upper electrode 13, and the third upper electrode 15 were formed.

In the present example 1, the width $W_1$ of the first channel 21, the length $L_1$ of the first channel 21, the width $W_2$ of the second channel 23, and the length $L_2$ of the second channel 23 were 1000 micrometers, 1 micrometer, 10 micrometers, and 10 micrometers, respectively. The channel size ratio α was 1000.

(d) A resist (not shown) was applied beneath the lower surface of the MgO(100) monocrystalline substrate 2 and patterned. Subsequently, the center part of the MgO(100) monocrystalline substrate 2 was etched with phosphoric acid heated at the temperature of 80 degree Celsius. The portion of the MgO which was not protected by the resist was etched with the phosphoric acid. The support film 3 was not etched. Since the structure shown in FIG. 6(d) decreases heat capacity greatly, the temperature change of the ferroelectric layer 7 can be reflected in the output voltage $V_{OUT}$ with higher sensitivity. Subsequently, the resist was removed to obtain the pyroelectric temperature sensor.

The pyroelectric temperature sensor was deposited in the thermostatic bath (not shown) at the temperature of 20 degree Celsius to measure the resistance value $R_{d1}$ of the first channel 21 and the resistance value $R_{u1}$ of the second channel 23. $R_{d1}$ was 45 MΩ, and $R_{u1}$ was 0.86 MΩ.

Next, the temperature of the thermostatic bath was changed to 30, 40, 50, 60, and 70 degree Celsius to measure the resistant value of the first channel 21 and the resistant value of the second channel 23.

Finally, the temperature of the thermostatic bath was changed to 80 degree Celsius to measure the resistant value $R_{d2}$ of the first channel 21 and the resistant value $R_{u2}$ of the second channel 23. $R_{d2}$ was 16 MΩ, and $R_{u2}$ was 1.0 MΩ.

Figure 7A:
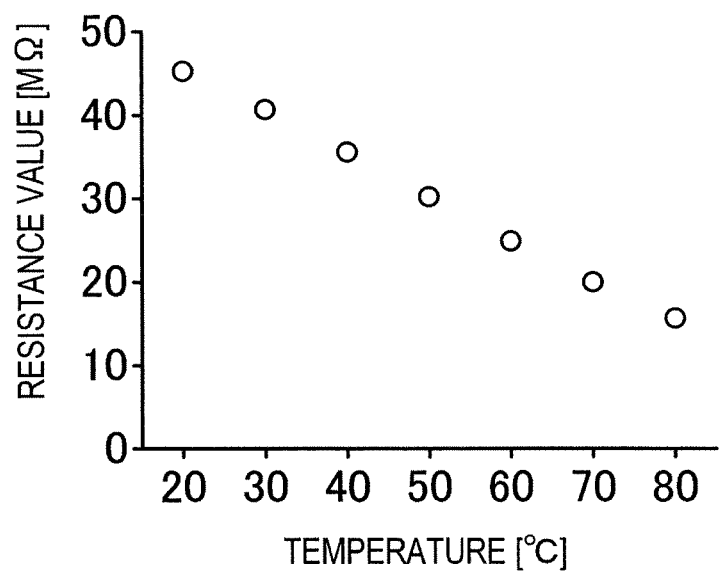
FIG. 7A shows relationship between the temperature and the resistance value of the first channel 21 in the example 1.
Figure 7B:
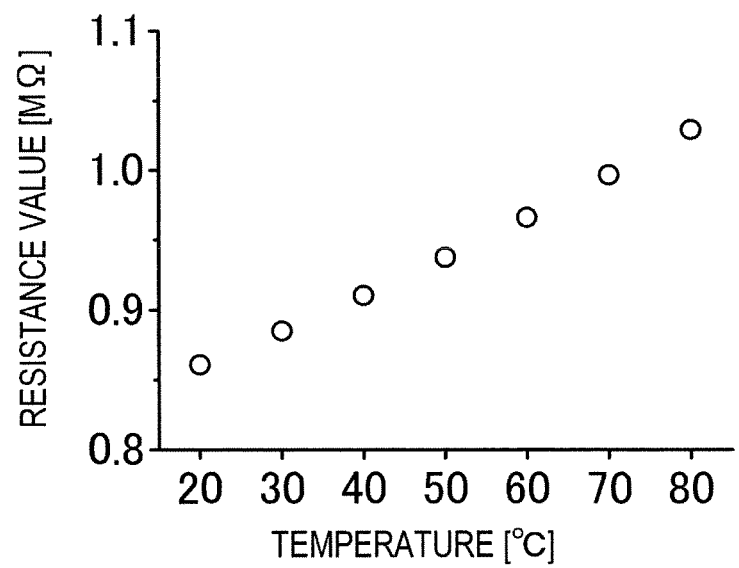
FIG. 7B shows relationship between the temperature and the resistance value of the second channel 23.

FIG. 7A shows relationships between the temperature and the resistance value of the first channel 21 obtained by the above-mentioned measure. FIG. 7B shows relationships between the temperature and the resistance value of the second channel 23. The source voltage $V_{DD}$ was 100 mV.

Figures 8, 9:
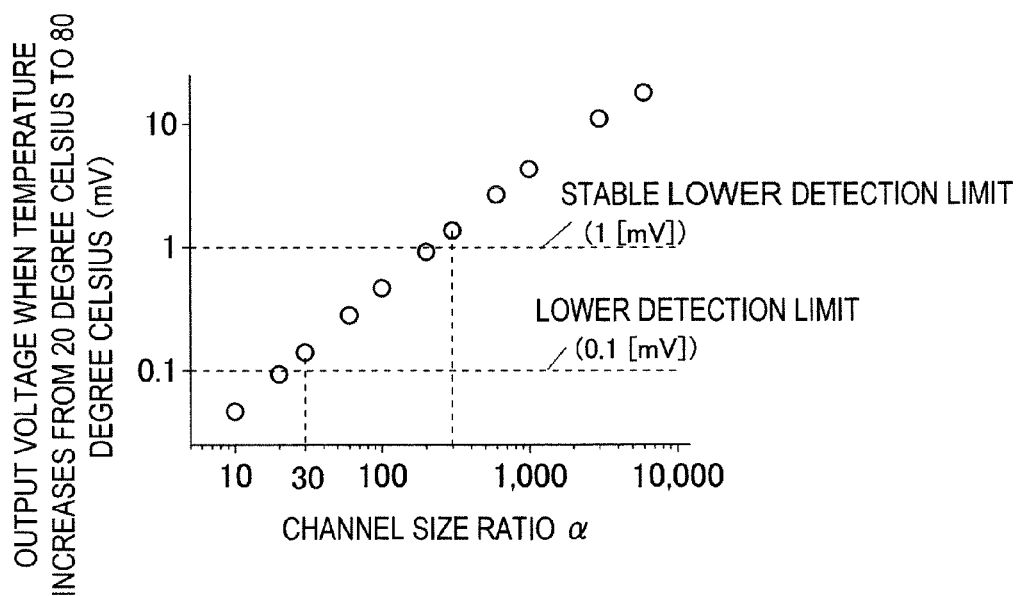
FIG. 8 shows a table showing a comparison between the temperature of a thermostatic bath and the temperature calculated from the output voltage in the example 1.
FIG. 9 shows a graph in which the horizontal axis represents the channel size ratio α, and the vertical axis represents the output voltage change in the example 2.

FIG. 8 shows a table showing comparison between the temperature of the thermostatic bath and the temperature calculated from the output voltage based on the equation (2). As shown in FIG. 8, the actual temperature agreed with the calculated temperature.

Example 2

FIG. 9 shows a graph in which the horizontal axis represents the channel size ratio α, and the vertical axis represents the output voltage change. The output change is defined as the output voltage change of the pyroelectric temperature sensor when the temperature increased from 20 degree Celsius to 80 degree Celsius. As shown in FIG. 9, when the polarization direction of the first ferroelectric part is substantially downward from the semiconductor layer to the lower electrode group, the output voltage change becomes greater in accordance with the increase of α. Since the lower detection limit of the voltage change was 0.1 mV, detectable output voltage change is obtained when the value of α is not less than 30. Preferably, the value of α is not less than 300 since the output voltage change of not less than 1 mV is obtained.

Example 3

Figure 10A:
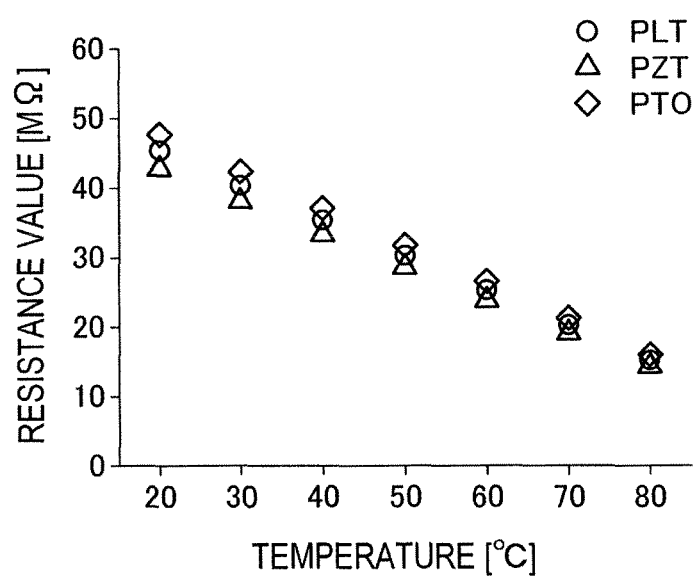
FIG. 10A shows a relationship between the temperature and the resistance value of the first channel 21 in the example 3 when different materials are used in the ferroelectric layer 7.
Figure 10B:
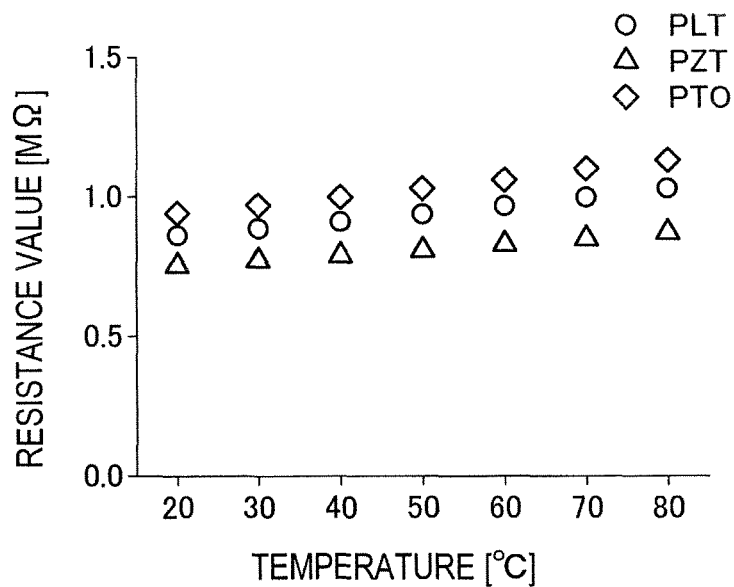
FIG. 10B shows a relationship between the temperature and the resistance value of the second channel 23 in the example 3 when different materials are used in the ferroelectric layer 7.

FIG. 10A shows a relationship between the temperature and the resistance value of the first channel 21 when different materials are used in the ferroelectric layer 7. FIG. 10B shows a relationship between the temperature and the resistance value of the second channel 23 when different materials are used in the ferroelectric layer 7. The first channel 21 and the second channel 23 have identical sizes to those of example 1.

In the example 3, Pb(Zr,Ti)O₃ (PZT) and PbTiO₃ (PTO) with a Zr:Ti ratio of 0.4:0.6 were employed in place of the PLT.

When the ferroelectric layer 7 consisted of the PZT, $R_{d1}$, $R_{u1}$, $R_{d2}$, and $R_{u2}$ were 43 MΩ, 0.75 MΩ, 14 MΩ, and 0.87 MΩ, respectively.

When the ferroelectric layer 7 consisted of the PTO, $R_{d1}$, $R_{u1}$, $R_{d2}$, and $R_{u2}$ were 48 MΩ, 0.94 MΩ, 16 MΩ, and 1.1 MΩ, respectively. In the example 3, similarly to the example 1, $R_{d1}$ and $R_{u1}$ were obtained when the temperature of the thermostatic bath was 20 degree Celsius. $R_{d2}$ and $R_{u2}$ were obtained when the temperature of the thermostatic bath was 80 degree Celsius.

Figures 11, 12:
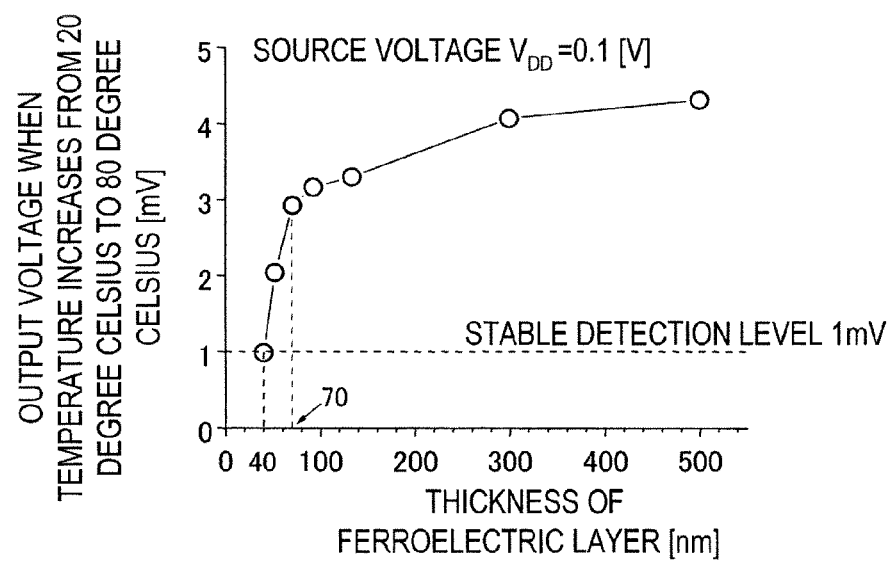
FIG. 11 shows a table showing a comparison between the temperature of the thermostatic bath with the temperature calculated from the output voltage in the example 3.
FIG. 12 shows a relationship between the thickness of the ferroelectric layer 7 and the output voltage of the pyroelectric temperature sensor when the temperature increases from 20 degree Celsius to 80 degree Celsius in the example 4.

FIG. 11 shows a table showing comparison between the temperature of the thermostatic bath and the temperature calculated from the output voltage based on the equation (2). As shown in FIG. 11, the actual temperature agreed with the calculated temperature.

Example 4

In the example 4, the output voltage of the pyroelectric temperature sensor was measured when the thickness of the ferroelectric layer 7 was varied. FIG. 12 shows a relationship between the thickness of the ferroelectric layer 7 and the output voltage change of the pyroelectric temperature sensor when the temperature increases from 20 degree Celsius to 80 degree Celsius.

As shown in FIG. 12, when the thickness of the ferroelectric layer 7 is thinner, the output voltage change became smaller. Particularly, when the thickness of the ferroelectric layer 7 is less than 70 nm, the output voltage change became lower rapidly. In light of stable detection, it is preferred that the voltage change is not less than 1 mV. As understood from FIG. 12, it is preferred that the ferroelectric layer 7 has a thickness of not less than 40 nm to obtain the output voltage change of not less than 1 mV.

Example 5

Figure 13:
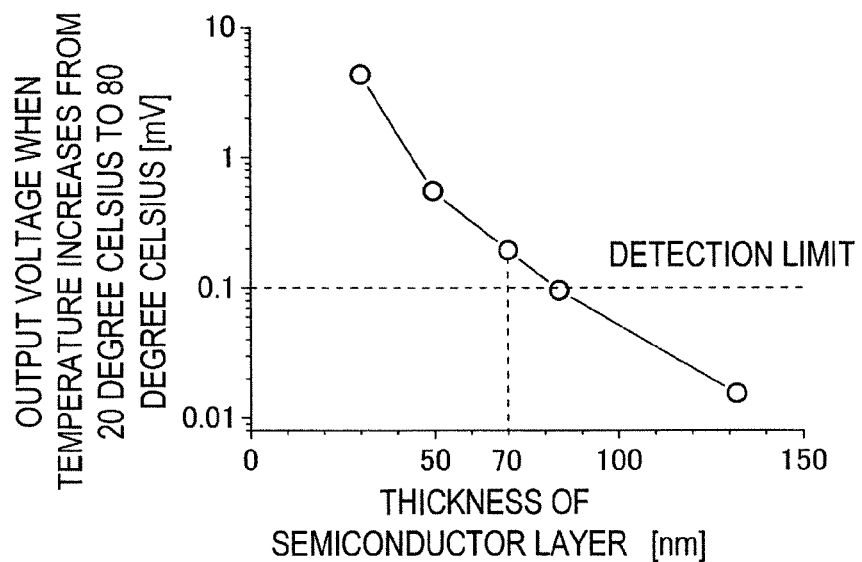
FIG. 13 shows a relationship between the thickness of the semiconductor layer 9 and the output voltage of the pyroelectric temperature sensor when the temperature increases from 20 degree Celsius to 80 degree Celsius in the example 5.
Figure 14:
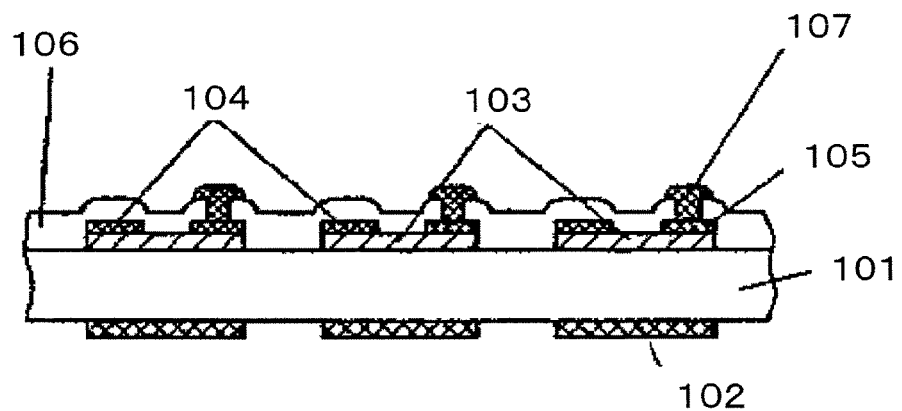
FIG. 14 shows a cross-sectional view of the pyroelectric temperature sensor disclosed in the patent document 1.

In the example 5, the output voltage of the pyroelectric temperature sensor was measured when the thickness of the semiconductor layer 9 was varied. FIG. 13 shows a relationship between the thickness of the semiconductor layer 9 and the output voltage change of the pyroelectric temperature sensor when the temperature increases from 20 degree Celsius to 80 degree Celsius.

As shown in FIG. 13, when the thickness of the semiconductor layer 9 is thicker, the output voltage change became smaller. Particularly, when the thickness of the semiconductor layer 9 is more than 70 nm, the output voltage became less than the lower detection limit (0.1 mV). Accordingly, as understood from FIG. 13, it is preferred that the semiconductor layer 9 has a thickness of not more than 70 nm.

The temperature of the various objects can be measured with the method of the present disclosure.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A method for measuring a temperature with a temperature sensor, the method comprising steps of:
   a step (a) of preparing the temperature sensor, wherein:
   the temperature sensor comprises a lower electrode group, a ferroelectric layer having polarization, a semiconductor layer, and an upper electrode group,
   the ferroelectric layer is disposed between the lower electrode group and the semiconductor layer and the semiconductor layer is disposed between the ferroelectric layer and the upper electrode group,
   the lower electrode group comprises a first lower electrode and a second lower electrode,
   the upper electrode group comprises a first upper electrode, a second upper electrode, and a third upper electrode,
   the second upper electrode is interposed between the first upper electrode and the third upper electrode in a plan view,
   a first ferroelectric part of the ferroelectric layer is interposed between the first lower electrode and the first upper electrode,
   a second ferroelectric part of the ferroelectric layer is interposed between the second lower electrode and the third upper electrode,
   the second ferroelectric part has an inverted polarization direction of the polarization direction of the first ferroelectric part, and
   the semiconductor layer includes a first channel disposed between the first upper electrode and the second upper electrode, and a second channel disposed between the second upper electrode and the third upper electrode;
   a step (b) of applying a voltage $V_{DD}$ and a voltage of 0V to the first upper electrode and the third upper electrode, respectively, to measure an output voltage $V_{OUT}$ from the second upper electrode; and
   a step (c) of calculating the temperature from the following equation (2):

$$T = \frac{\{(R_{d1} + R_{u1})T_2 - (R_{d2} + R_{u2})T_1\}V_{out} + (R_{u2}T_1 - R_{u1}T_2)V_{DD}}{(R_{d1} - R_{d2} + R_{u1} - R_{u2})V_{out} + (R_{u2} - R_{u1})V_{DD}} \quad (2)$$

where, $R_{d1}$ represents a resistance value of the first channel when temperature T of the ferroelectric layer is $T_1$,
   $R_{u1}$ represents a resistance value of the second channel when the temperature T of the ferroelectric layer is $T_1$,
   $R_{d2}$ represents a resistance value of the first channel when the temperature T of the ferroelectric layer is $T_2$, and
   $R_{u2}$ represents a resistance value of the second channel when the temperature T of the ferroelectric layer is $T_2$.

2. The method of claim 1, wherein:
   the first channel has a width of $W_1$ and a length of $L_1$,
   the second channel has a width of $W_2$ and a length of $L_2$, and
   a channel size ratio α represented by the following equation (1) is 30 or more:

$$\alpha = (W_1/L_1)/(W_2/L_2) \quad (1).$$

3. The method of claim 1, wherein the ferroelectric layer has a thickness of 40 nm or more.

4. The method of claim 1, wherein the semiconductor layer has a thickness of 70 nm or less.

5. The method of claim 3, wherein the semiconductor layer has a thickness of 70 nm or less.

6. The method of claim 2, wherein the ferroelectric layer has a thickness of 40 nm or more.

7. The method of claim 2, wherein the semiconductor layer has a thickness of 70 nm or less.

8. The method of claim 6, wherein the semiconductor layer has a thickness of 70 nm or less.

9. The temperature sensor of claim 1, wherein the ferroelectric layer is $(Pb,La)TiO_3$, $Pb(Zr,Ti)O_3$, or $PbTiO_3$.

10. The method of claim 1, wherein the ferroelectric layer includes a first ferroelectric part disposed below the first channel and a second ferroelectric part disposed below the second channel, and
    a polarization direction of the first ferroelectric part is opposite to a polarization direction of the second first ferroelectric part.

11. The method claim 2, wherein the polarization direction of the first ferroelectric part is substantially downward from the semiconductor layer to the lower electrode group.

12. A temperature sensor comprising:
    a lower electrode group;
    a ferroelectric layer having polarization;
    a semiconductor layer; and
    an upper electrode group, wherein:
    the ferroelectric layer is disposed between the lower electrode group and the semiconductor layer, and the semiconductor layer is disposed between the ferroelectric layer and the upper electrode group,
    the lower electrode group comprises a first lower electrode and a second lower electrode,
    the upper electrode group comprises a first upper electrode, a second upper electrode, and a third upper electrode,
    the second upper electrode is interposed between the first upper electrode and the third upper electrode in a plan view, and
    the semiconductor layer includes a first channel disposed between the first upper electrode and the second upper electrode, and a second channel disposed between the second upper electrode and the third upper electrode.

13. The temperature sensor of claim 12, wherein:
    the first channel has a width of $W_1$ and a length of $L_1$,
    the second channel has a width of $W_2$ and a length of $L_2$, and
    a channel size ratio α represented by the following equation (1) is 30 or more:

$$\alpha = (W_1/L_1)/(W_2/L_2) \quad (1).$$

14. The temperature sensor of claim 12, wherein the ferroelectric layer has a thickness of 40 nm or more.

15. The temperature sensor of claim 12, wherein the semiconductor layer has a thickness of 70 nm or less.

16. The temperature sensor of claim 14, wherein the semiconductor layer has a thickness of 70 nm or less.

17. The temperature sensor of claim 13, wherein the ferroelectric layer has a thickness of 40 nm or more.

18. The temperature sensor of claim 13, wherein the semiconductor layer has a thickness of 70 nm or less.

19. The temperature sensor of claim 17, wherein the semiconductor layer has a thickness of 70 nm or less.

20. The temperature sensor of claim 12, wherein the ferroelectric layer includes a first ferroelectric part disposed below the first channel and a second ferroelectric part disposed below the second channel, and
a polarization direction of the first ferroelectric part is opposite to a polarization direction of the second first ferroelectric part.

21. The temperature sensor of claim 13, wherein the polarization direction of the first ferroelectric part is substantially downward from the semiconductor layer to the lower electrode group.

22. A temperature measuring device comprising a temperature sensor and an operating device, wherein:
the temperature sensor comprises a lower electrode group, a ferroelectric layer, a semiconductor layer, and an upper electrode group,
the ferroelectric layer is disposed between the lower electrode group and the semiconductor layer, and the semiconductor layer is disposed between the ferroelectric layer and the upper electrode group,
the lower electrode group comprises a first lower electrode and a second lower electrode,
the upper electrode group comprises a first upper electrode, a second upper electrode, and a third upper electrode,
the second upper electrode is interposed between the first upper electrode and the third upper electrode in a plan view,
the semiconductor layer includes a first channel disposed between the first upper electrode and the second upper electrode, and a second channel disposed between the second upper electrode and the third upper electrode,
the operating device comprises a processing unit, a memory unit, an output unit, and an input unit,
an output voltage $Y_{OUT}$ from the second upper electrode is input to the input unit,
the memory unit memorizes constant values $T_1$, $T_2$, $R_{d1}$, $R_{u1}$, $R_{d2}$, and $R_{u2}$, and
the processing unit calculates temperature T from the following equation (2) with reference to the memory unit, $$T = \frac{\{(R_{d1} + R_{u1})T_2 - (R_{d2} + R_{u2})T_1\}V_{out} + (R_{u2}T_1 - R_{u1}T_2)V_{DD}}{(R_{d1} - R_{d2} + R_{u1} - R_{u2})V_{out} + (R_{u2} - R_{u1})V_{DD}} \quad (2)$$

where $V_{DD}$ is a voltage applied to the first upper electrode,
the output unit outputs the calculated temperature T,
the output voltage $V_{out}$ is a voltage from the second upper electrode when an voltage $V_{DD}$ and 0V are applied to the first upper electrode and third upper electrode, respectively,
$R_{d1}$ represents a resistance value of the first channel when temperature of the ferroelectric layer is $T_1$,
$R_{u1}$ represents a resistance value of the second channel when temperature of the ferroelectric layer is $T_1$,
$R_{d2}$ represents a resistance value of the first channel when temperature of the ferroelectric layer is T2, and
$R_{u2}$ represents a resistance value of the second channel when temperature of the ferroelectric layer is $T_2$.

23. The temperature measuring device of claim 22, wherein:
the first channel has width of $W_1$ and length of $L_1$,
the second channel has width of $W_2$ and length of $L_2$, and
a channel size ratio α represented by the following equation (1) is 30 or more:

$$\alpha = (W_1/L_1)/(W_2/L_2) \quad (1).$$

24. The temperature measuring device of claim 22, wherein the ferroelectric layer has a thickness of 40 nm or more.

25. The temperature measuring device of claim 22, wherein the semiconductor layer has a thickness of 70 nm or less.

26. The temperature measuring device of claim 24, wherein the semiconductor layer has a thickness of 70 nm or less.

27. The temperature measuring device of claim 23, wherein the ferroelectric layer has a thickness of 40 nm or more.

28. The temperature measuring device of claim 23, wherein the semiconductor layer has a thickness of 70 nm or less.

29. The temperature measuring device of claim 27, wherein the semiconductor layer has a thickness of 70 nm or less.

30. The temperature measuring device of claim 22, wherein the ferroelectric layer includes a first ferroelectric part disposed below the first channel and a second ferroelectric part disposed below the second channel, and
a polarization direction of the first ferroelectric part is opposite to a polarization direction of the second first ferroelectric part.

31. The temperature measuring device of claim 23, wherein the polarization direction of the first ferroelectric part is substantially downward from the semiconductor layer to the lower electrode group.

* * * * *